United States Patent
Harrell et al.

(10) Patent No.: US 11,940,496 B2
(45) Date of Patent: Mar. 26, 2024

(54) OUTPUT VOLTAGE GLITCH REDUCTION IN ATE SYSTEMS

(71) Applicant: Analog Devices, Inc., Wilmington, MA (US)

(72) Inventors: Michael E. Harrell, Colorado Springs, CO (US); Anthony Eric Turvey, Poughkeepsie, NY (US); Stefano I D'Aquino, Westford, MA (US); Jennifer W. Pierdomenico, Temple, PA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/904,931

(22) PCT Filed: Feb. 24, 2021

(86) PCT No.: PCT/US2021/019368
§ 371 (c)(1),
(2) Date: Aug. 24, 2022

(87) PCT Pub. No.: WO2021/173635
PCT Pub. Date: Sep. 2, 2021

(65) Prior Publication Data
US 2023/0114208 A1  Apr. 13, 2023

Related U.S. Application Data

(60) Provisional application No. 63/114,775, filed on Nov. 17, 2020, provisional application No. 62/980,772, filed on Feb. 24, 2020.

(51) Int. Cl.
*G01R 31/319* (2006.01)
*G01R 31/28* (2006.01)
(Continued)

(52) U.S. Cl.
CPC .... *G01R 31/31924* (2013.01); *G01R 31/2834* (2013.01); *H03F 1/523* (2013.01);
(Continued)

(58) Field of Classification Search
CPC .......... G01R 31/31924; G01R 31/2834; H03F 1/523; H03F 3/04; H03F 3/16;
(Continued)

(56) References Cited

U.S. PATENT DOCUMENTS 4,704,575 A  *  11/1987  Arnoux .................... G01R 1/22
324/117 H
5,010,297 A       4/1991  Babcock
(Continued)

FOREIGN PATENT DOCUMENTS

CN       105680431 B       7/2018
CN       116615662 A       8/2023
(Continued)

OTHER PUBLICATIONS

"25V Span, 800mA Device Power Supply (DPS)", Maxim Integrated Products, (2011), 24 pgs.
(Continued)

*Primary Examiner* — James C Kerveros
(74) *Attorney, Agent, or Firm* — Schwegman Lundberg & Woessner, P.A.

(57) ABSTRACT

An automated testing system comprises a high side switch circuit coupled to an input/output (I/O) connection, a low side switch circuit coupled to the I/O connection, a high side force amplifier (HFA) coupled to the high side switch, a low side force amplifier (LFA) coupled to the low side switch, an adjusting circuit coupled to the HFA and the LFA, and a control circuit configured to change the adjusting circuit to change control of current at the I/O connection from one of the HFA or LFA to the other of the HFA or LFA.

9 Claims, 4 Drawing Sheets

(51) Int. Cl.
*H03F 1/52* (2006.01)
*H03F 3/04* (2006.01)
*H03F 3/16* (2006.01)

(52) U.S. Cl.
CPC ............... *H03F 3/04* (2013.01); *H03F 3/16* (2013.01); *H03F 2200/441* (2013.01)

(58) Field of Classification Search
CPC ......... H03F 2200/441; H03F 2200/444; H03F 2200/453; H03F 3/301
USPC .......................................................... 714/734
See application file for complete search history.

(56) References Cited

U.S. PATENT DOCUMENTS

| | | | |
|---|---|---|---|
| 5,463,315 | A | 10/1995 | Grace et al. |
| 5,745,003 | A | 4/1998 | Wakimoto et al. |
| 5,917,331 | A | 6/1999 | Persons |
| 6,563,352 | B1* | 5/2003 | Gohel ............... H03K 19/0826 327/108 |
| 6,677,775 | B2 | 1/2004 | Babcock |
| 6,756,807 | B2 | 6/2004 | Johnson et al. |
| 6,900,621 | B1 | 5/2005 | Gunther |
| 7,154,260 | B2 | 12/2006 | Chow |
| 7,174,143 | B1 | 2/2007 | Turvey |
| 7,521,937 | B2 | 4/2009 | Nagata |
| 7,538,539 | B1 | 5/2009 | Balke |
| 7,903,008 | B2 | 3/2011 | Regier |
| 7,978,109 | B1 | 7/2011 | Kuramochi |
| 8,207,725 | B2 | 6/2012 | Sullivan et al. |
| 8,710,541 | B2 | 4/2014 | Aherne et al. |
| 8,829,975 | B2 | 9/2014 | Aherne |
| 8,975,913 | B2 | 3/2015 | Smith |
| 9,182,767 | B2 | 11/2015 | Srivastava et al. |
| 9,397,635 | B2 | 7/2016 | Costa |
| 9,435,863 | B2 | 9/2016 | Chen et al. |
| 9,523,722 | B2 | 12/2016 | Tasher et al. |
| 9,671,427 | B2 | 6/2017 | Johnson et al. |
| 10,192,630 | B1 | 1/2019 | Hoskins |
| 10,345,418 | B2 | 7/2019 | Wadell et al. |
| 10,778,212 | B1 | 9/2020 | D'Aquino et al. |
| 11,022,629 | B2 | 6/2021 | D'Aquino et al. |
| 11,054,444 | B2 | 7/2021 | Borthwick |
| 11,105,843 | B2 | 8/2021 | Singh et al. |
| 2002/0021148 | A1 | 2/2002 | Goren et al. |
| 2002/0121885 | A1 | 9/2002 | Taylor et al. |
| 2006/0273811 | A1* | 12/2006 | Haigh ............... G01R 31/31924 324/537 |
| 2007/0069755 | A1 | 3/2007 | Sartschev |
| 2011/0115544 | A1 | 5/2011 | Birk |
| 2012/0105066 | A1* | 5/2012 | Marvin ............... H03F 3/45928 324/426 |
| 2014/0070831 | A1 | 3/2014 | Kushnick et al. |
| 2015/0038092 | A1* | 2/2015 | Andrys ............... H03F 1/0233 327/318 |
| 2016/0241019 | A1* | 8/2016 | Li ........................ H02H 9/025 |
| 2017/0269149 | A1 | 9/2017 | Mcquilkin |
| 2020/0011928 | A1 | 1/2020 | Mücke et al. |
| 2020/0041546 | A1 | 2/2020 | Liberty |
| 2020/0127624 | A1 | 4/2020 | Basilico et al. |
| 2020/0271717 | A1 | 8/2020 | Nakamura et al. |
| 2021/0021257 | A1 | 1/2021 | Shrivastava et al. |
| 2021/0255268 | A1 | 8/2021 | Golger |
| 2023/0114208 | A1* | 4/2023 | Harrell ............... H03F 3/04 714/734 |
| 2023/0176110 | A1 | 6/2023 | Harrell et al. |

FOREIGN PATENT DOCUMENTS

| | | |
|---|---|---|
| DE | 112021006392 T5 | 9/2023 |
| JP | H11133068 A | 5/1999 |
| JP | 2008209997 A | 9/2008 |
| JP | 2008301287 A | 12/2008 |
| JP | 2011043434 A | 3/2011 |
| TW | 200842384 A | 11/2008 |
| TW | I354804 B | 12/2011 |
| TW | I814168 B | 10/2023 |
| WO | WO-2008059766 A1 | 5/2008 |
| WO | WO-2021173635 A1 | 9/2021 |
| WO | WO-2021173638 A1 | 9/2021 |
| WO | WO-2022122561 A1 | 6/2022 |

OTHER PUBLICATIONS

"International Application Serial No. PCT/EP2021/084047, International Search Report dated Apr. 29, 2022", 4 pgs.
"International Application Serial No. PCT/EP2021/084047, Written Opinion dated Apr. 29, 2022", 10 pgs.
"International Application Serial No. PCT/US2021/019368, International Search Report dated Jun. 14, 2021", 4 pgs.
"International Application Serial No. PCT/US2021/019368, Written Opinion dated Jun. 14, 2021", 6 pgs.
"International Application Serial No. PCT/US2021/019372, International Search Report dated Jun. 8, 2021", 3 pgs.
"International Application Serial No. PCT/US2021/019372, Written Opinion dated Jun. 8, 2021", 6 pgs.
Ding, Jialin, "DC Parametric Test and IDDQ Test Using Advantest T2000 ATE", MS Thesis, Auburn University, (Aug. 1, 2015), 100 pgs.
Liberti, Anselmo Gianluca, et al., "Suppressing voltage glitches in SiC MOSFETs", PCIM Europe 2019, Nuremberg, Germany, (May 7-9, 2019), 7 pgs.
Mauromicale, Giuseppe, "Improvement of SiC power module layout to mitigate the gate-source overvoltage during switching operation", 2019 AEIT International Conference of Electrical and Electronic Technologies for Automotive (AEIT Automotive), IEEE, (2019), 16 pgs.
"International Application Serial No. PCT/EP2021/084047, International Preliminary Report on Patentability dated Jun. 22, 2023", 12 pgs.
"International Application Serial No. PCT/US2021/019368, International Preliminary Report on Patentability dated Sep. 9, 2022", 8 pgs.
"International Application Serial No. PCT/US2021/019372, International Preliminary Report on Patentability dated Sep. 9, 2022", 7 pgs.
"Taiwanese Application Serial No. 110145810, Office Action dated Nov. 4, 2022", W/O English Translation, 12 pgs.
"Taiwanese Application Serial No. 110145810, Response filed Feb. 1, 2023 to Office Action dated Nov. 4, 2022", w/o English Claims, 53 pgs.
"Chinese Application Serial No. 202180082606.2, Voluntary Amendment filed Oct. 31, 2023".

* cited by examiner

OUTPUT VOLTAGE GLITCH REDUCTION IN ATE SYSTEMS

CLAIM OF PRIORITY

This application is a U.S. National Stage of PCT Application Ser. No. PCT/2021/019368, filed Feb. 24, 2021, and published as WO 2021/173635A1 on Sep. 2, 2021, which claims priority to U.S. Provisional Application Ser. No. 62/980,772, filed Feb. 24, 2020, and U.S. Provisional Application Ser. No. 63/114,775, filed Nov. 17, 2020, which are hereby incorporated by reference herein in their entirety.

FIELD OF THE DISCLOSURE

This document relates to automated testing systems.

BACKGROUND

Automated test equipment can be used to assess the quality of manufactured parts. Automated test systems can include instrumentation circuitry to apply test signals to a device under test (DUT) to check for errors or flaws in the DUT. The test signals applied by the instrumentation circuitry should not cause false indications of failures or mask actual failures of the DUT.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Automated test systems can include instrumentation circuitry to apply test signals to a device under test (DUT), but the test signals generated by the instrumentation circuitry should not cause false indications of failures or mask actual failures of the DUT. Test circuitry can apply current to the DUT.

Switching from one current range to another current range during the testing can cause undesired glitches at a test monitoring point.

Figure 1:
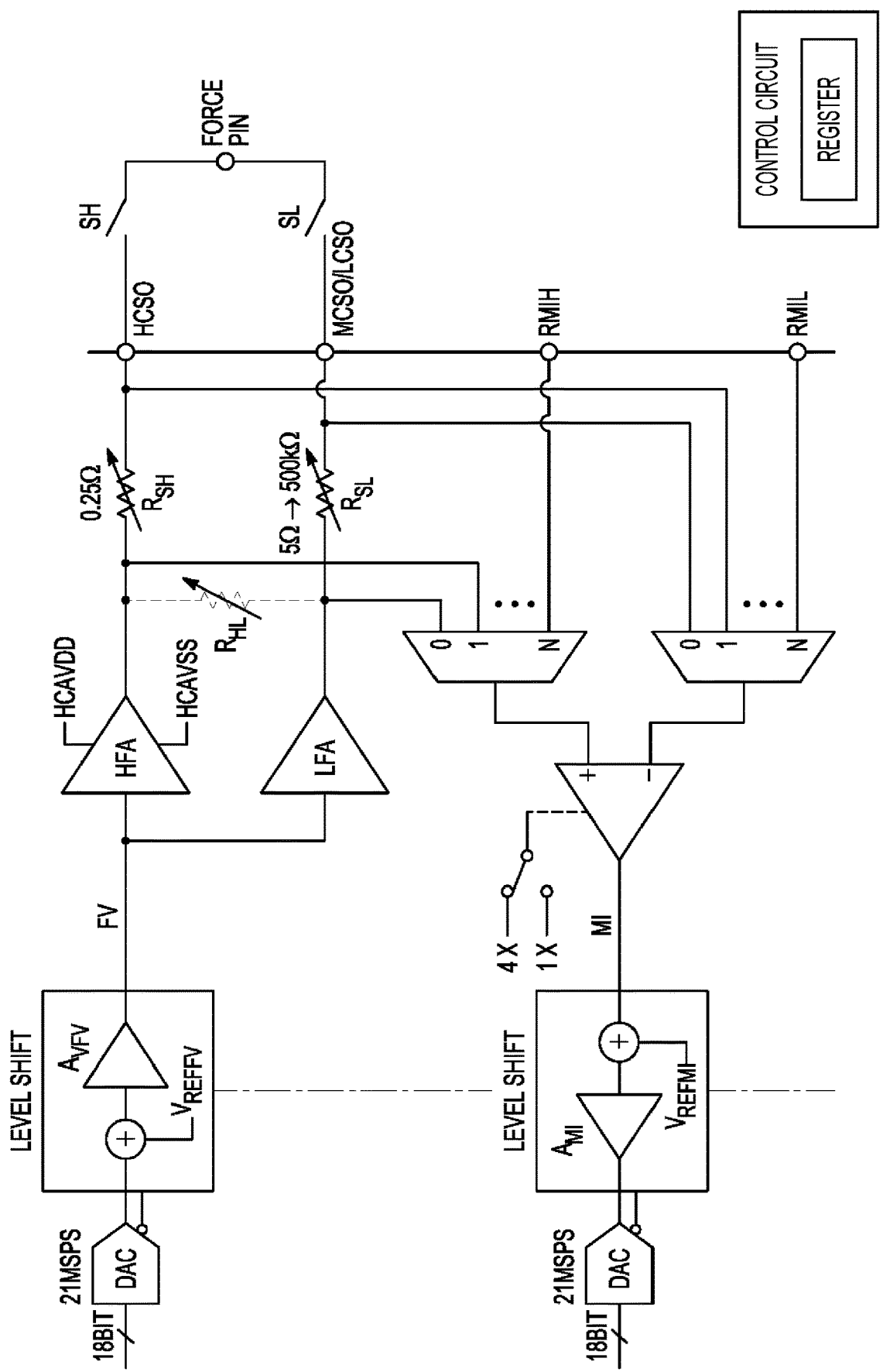
FIG. 1 is a schematic of an example of a testing circuit of an automated test system.

FIG. 1 is a circuit schematic of an example of test circuitry for an automated test system. The circuit includes two output stages. Each output stage includes a force amplifier. One stage includes a high current force amplifier (HFA), and the second stage includes a low current force amplifier (LFA). The HFA and LFA are coupled to high side switch circuit (SH) and low side switch circuit (SL) respectively. Switches SH and SL are coupled to a FORCE pin.

The voltages across each output stage can be significantly different and load-current dependent. Suddenly transitioning the output from one output stage to another output stage can cause a glitch equal to the difference of the voltage across each output stage. This voltage glitch is undesirable in most applications.

Each of the output stage amplifiers (HFA, LFA) includes a current clamp circuit that sets the level of output current for the amplifier. The current clamp circuits are programmable. For example, each of the current clamp circuits may be connected to a writable register of a control circuit and the control circuit writes a specific value to the register to set the value of the current in the current clamp circuit. The control circuit may include processing circuitry (e.g., one or more of a processor, an application specific integrated circuit, or a field programmable gate array) to perform the functions described.

To reduce or remove any glitch at the output due to changing the output stage, a user can progressively increase or decrease the value of the output current for one or both amplifiers. For example, the user can progressively decrease the maximum output current provided by an output stage from a high level (e.g., 200 milliamps (200 mA)), to a low level (e.g., 0 mA). Conversely, the user can progressively increase the output current from a low level (e.g., 0 mA) to a high level (e.g., 200 mA).

The speed of the transition of the current level is controlled by the user (e.g., by one or more of user software, firmware or hardware), depending on how fast the user changes the value written in the register. By operating the clamp circuits of the HFA and LFA amplifiers at a speed slower than the bandwidth of the main loop of the test system circuit, the output glitch at the FORCE pin is greatly reduced.

In an illustrative example, assume that a DUT is connected to the circuit of FIG. 1 and that it is desired to transition the output current at the FORCE pin from the LEA to the HFA to change the range of current that can be provided to the DUT. Also assume the DUT is drawing 100 mA at the FORCE pin. Further assume that the clamp circuit of the HFA is set to 0 mA, effectively turning in the HFA OFF, and that the clamp circuit of the LFA is set to 200 mA, effectively causing the LFA to source the entire 100 mA to the DUT.

The HFA clamp circuit is turned ON by writing a register to transition the HFA clamp circuit gradually and slowly from 0 mA to 200 mA. If the LFA is 10 times smaller than the HFA (e.g., the active circuit elements of the output stage of the LFA are 10 times smaller than the active elements of the HFA), by the end of the transition the HFA will absorb 90% of the current delivered to the DUT, and the remaining 10% is sourced by the LFA. The speed of the transition is made slower compared to the bandwidth of the main loop of the test system to keep any output glitch resulting from the transition small.

The LFA is then turned OFF by writing a register to gradually transition the LFA clamp from 200 mA to 0 mA, again using a transition speed that is slower than the bandwidth of the main loop of the test system. In this way the glitch at the output and at the DUT is minimized. The reverse procedure can be used to transition the output current at the FORCE pin from the HFA to the LFA.

The clamp circuit of the force amplifiers forces or pegs the gate-to-source voltage ($V_{GS}$) of the output stage. This limits the current that the output stage can deliver to the DUT. A "suitable" $V_{GS}$ can be adjusted with an external control current, which makes the maximum current delivered to the DUT programmable over a wider dynamic range.

Figure 2:
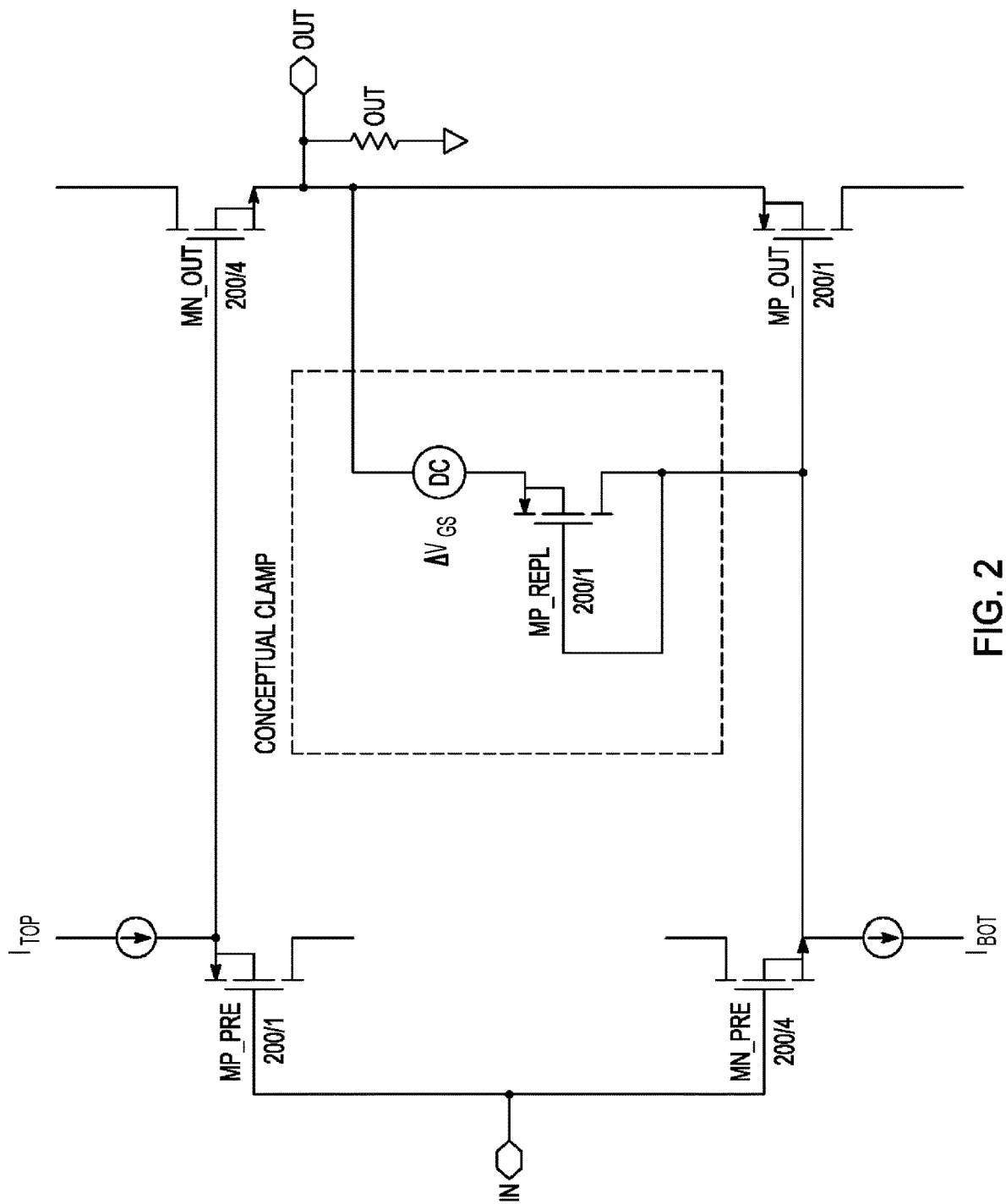
FIGS. 2-4 are examples of current clamp circuits useable in the testing circuit of FIG. 1.

FIG. 2 is a schematic of an example of an adjustable current clamp circuit useable in the force amplifiers to clamp the amplifier output current to a programmable value to protect the DUT and the test system. The DUT is represented by the output resistance OUT.

In the clamp circuit, transistors MP_PRE, MP_OUT, and MN_OUT make up a complementary emitter-follower output buffer, which is biased by constant current sources $I_{TOP}$ and $I_{BOT}$. Device MP_REPL is a replica of output device MP_OUT. Replica device MP-REPL is a p-type field effect transistor (PFET) connected as a diode.

In the clamped condition and when sinking current at the output of the buffer, as shown in FIG. 2 current from current source $I_{BOT}$ flows in its entirety through device MP_REPL and voltage source $\Delta$Vgs.

Therefore, in the clamped condition device MP_REPL (plus voltage source $\Delta$Vgs) and output device MP_OUT behave as a flying current mirror, with device MN_REPL (plus voltage source $\Delta$Vgs) being the input maker diode of the mirror and transistor MP_OUT being the output device of the mirror. The output current $I_{OUT}$ is the sum of currents $I_{BOT}$ and $I_{MP\_OUT}$, with current $I_{MP\_OUT}$ being a scaled version of $I_{BOT}$ according to the area ratio of devices MP_OUT and MP_REPL and the value of voltage $\Delta$Vgs.

Figure 3:
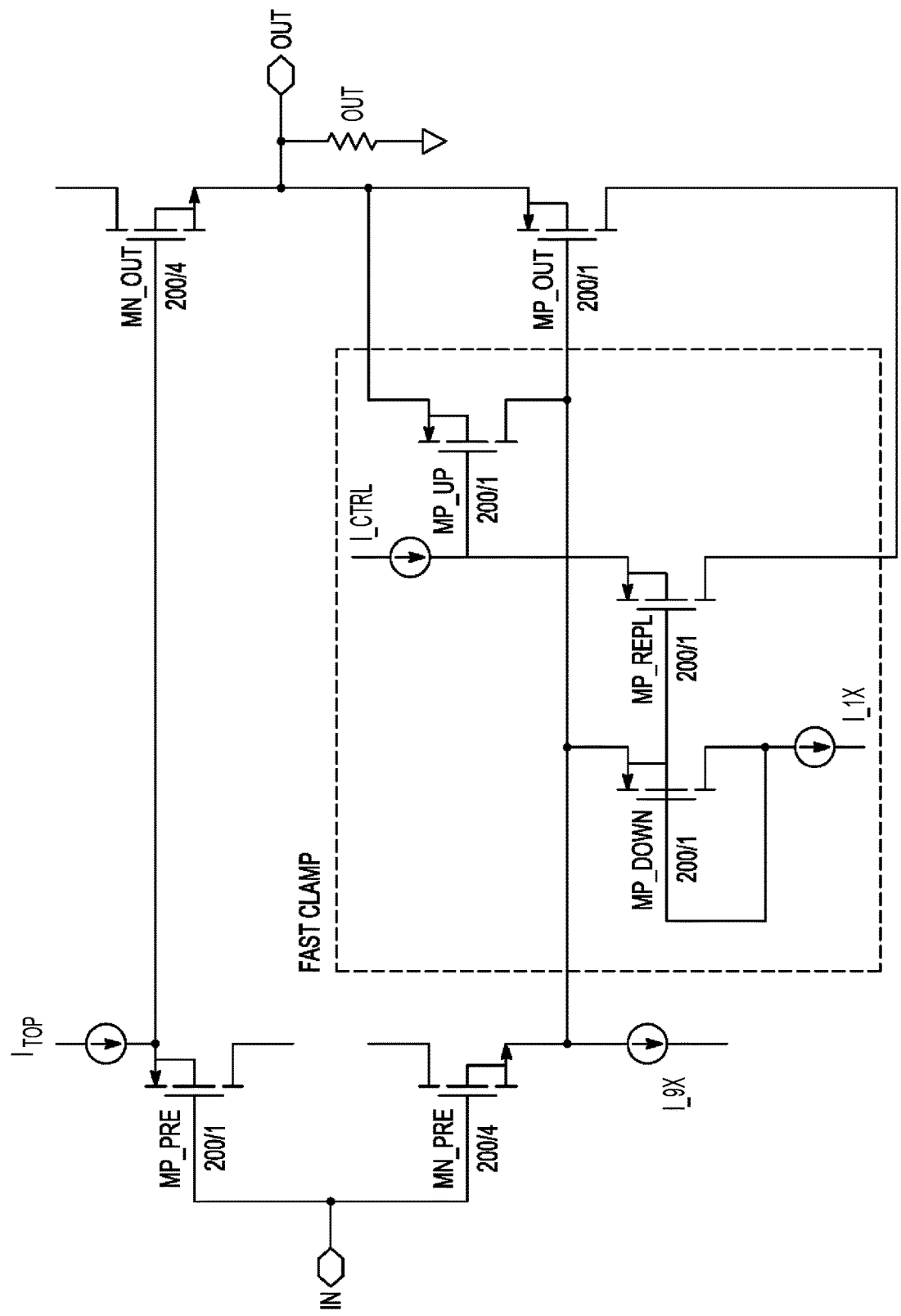

FIG. 3 is a schematic of an example of a current clamp circuit with the voltage $\Delta$Vgs set to zero. The current $I_{BOT}$ is split into two components: (I_9x) and (I_1x), or $I_{BOT}$=(I_9x)+(I_1x), where current (I_9x) is nine times the current of (I_1x).

As in the example of FIG. 2, when the clamp circuit is active and in the clamp condition, current $I_{BOT}$ flows in its entirety into the device that is doing the clamping (MP_UP in FIG. 3). At the same time, device MN_PRE is completely starved of current.

Because the currents in MP_UP and MP_DOWN are fixed and known (IBOT and I_1X, respectively) when the clamp is active, these devices can be sized to cancel their gate-to-source voltages ($V_{GS}$) against each other (in the example of FIG. 3, MP_UP is ten times (10x) larger than MP_DOWN). Therefore, the $V_{GS}$ MP_REPL is exactly applied across the $V_{GS}$ of the output device MP_OUT when the clamp circuit is in the clamp condition.

Current I_ctrl controls the $V_{GS}$ of MP_REPL, so it controls the current in the output devices. The current $I_{CTRL}$ can be used to gradually transition the clamp current in the LFA and HFA amplifiers in the circuit of FIG. 1. A register can be used to set the value of $I_{CTRL}$, and the value of the register can be gradually changed to gradually transition the current clamp value of LFA or HFA. This makes the current clamp circuit programmable.

Because the current in MP_REPL mirrors the current (I_1x) in MP_DOWN, the current (I_1x) can also be varied (while keeping Ibot=I_9x+I_1x constant) to affect the clamp level. Increasing (I_1x) decreases the clamp level, while decreasing (I_1x) increases the clamp level. The current source can be implemented with multiple unit size current sources connected in parallel. A register can be used to set the value of current (I_1x) by enabling the unit size current sources, and the value of the register can be gradually changed to gradually transition the current clamp value of LFA or HFA.

It should be noted that while output device MP_OUT and MP_REPL should be of the same type (e.g., both rated to 205 volts, or 205V), devices MP_UP and MP_DOWN can be of a different type than MP_OUT and MP_REPL (e.g., rated to 5V, for example) and the clamp circuit still works.

There is a potential reliability issue with the clamp circuit of FIG. 3. The transistor MP_REPL. Because MP_REPL is a replica of output device MP_OUT, MP_REPL at the maximum current density at which the output device MP_OUT will run when the output device MP_OUT clamps to max output current.

Adding a suitable voltage $\Delta$Vgs in series with the $V_{GS}$ of MP_REPL (while keeping the current through MP_REPL unchanged) would solve the potential reliability issue. Device MP_REPL would run at a lower current density (i.e., cooler) while appearing to have a larger $V_{GS}$. The addition of $\Delta$Vgs would also extend the achievable current clamp range.

Figure 4:
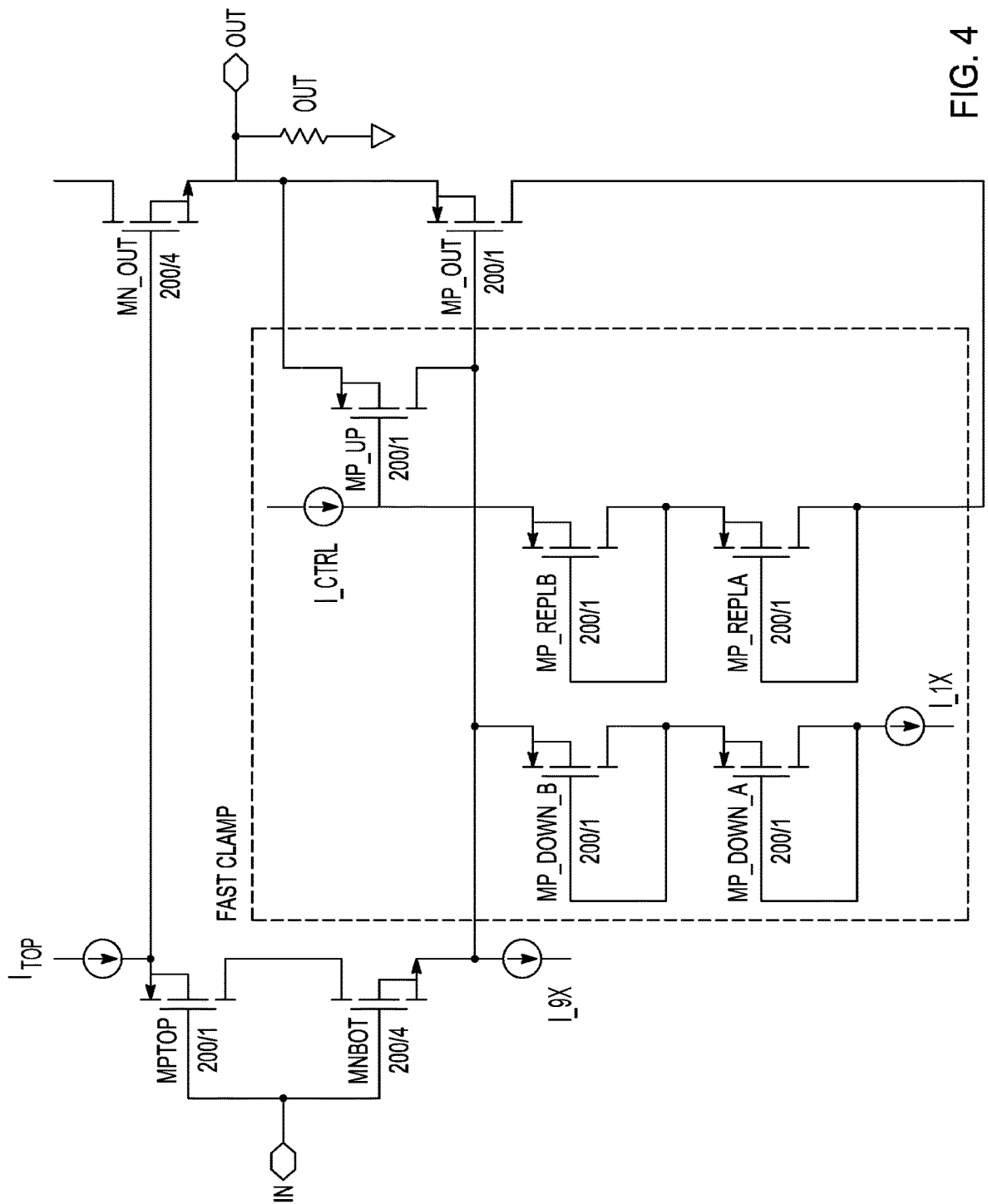

FIG. 4 is a schematic of an example of a current clamp circuit with a non-zero $\Delta$Vgs voltage. In FIG. 4, the $\Delta$Vgs voltage source of the example of FIG. 2 is implemented as the difference between the gate-to-source voltages ($V_{GS}$) of two devices running at different current densities.

The difference in FIG. 4 with respect to the example of FIG. 3 is the addition of devices MP_REPL B and MP_DOWN_B. The difference in $V_{GS}$ between the device, or $\Delta$Vgs, appears in series with the $V_{GS}$ of MP_REPL. As in the example of FIG. 3, the $V_{GS}$ MP_UP and MP_DOWN cancel each other. Therefore, the $V_{GS}$ of output device MP_OUT is clamped to the $V_{GS}$ of MP_REPL plus $\Delta$Vgs.

The mirror ratio of the flying current mirror can be adjusted by varying the voltage $\Delta$Vgs. If the voltage $\Delta$Vgs is programmable, the clamp circuits of FIGS. 2 and 4 are programmable and can be used to gradually transition the clamp current in the LFA and HFA amplifiers of FIG. 1. The clamp circuit is turned ON by writing a register to transition the clamp circuit through a current range.

The clamp level should be independent on process and the change in clamp current level should be linear with a change in the control current. It can be shown that the current $I_{MP\_OUT}$ of the output device MP_OUT is:

$$\text{Imp\_out} = (2 * \sqrt[4]{k} - 1)^2 * (I_{1x}) * M$$

where ($I_{CTRL\_INCR}$) is the change in $I_{CTRL}$, k=($I_{CTRL\_INCR}$)/(I_1x), and M is the size of output device MP_OUT. The equation above shows that the clamp output current $I_{MP\_OUT}$ does not depend on process and that dependency on k is nearly linear. Therefore, the clamp level change due to a change in control current $I_{CTRL}$ is nearly linear.

Simulation of the change in clamp level current $I_{MP\_OUT}$ with respect to the change control current $I_{CTRL\_INCR}$ showed that the clamped output current varies from 0.2 A to 3 A, when control current $I_{CTRL\_INCR}$ varies from ten micro-amps (10 μA) to 200 μA with the output voltage varied from −10V to +70V.

Because the output current is never sampled, the current clamp circuits described herein are likely to remain stable for a variety of DUTs. The current clamp pegs the VGS of the output device to a value a priori known to produce the desired max output current without ever measuring it.

Returning to FIG. 1, an alternative to setting the current in the amplifiers to transition current at the FORCE pin between force amplifiers is to use a variable resistance. According to some aspects, the test circuitry includes a variable resistor Rum: between the outputs of the HFA and LFA. This also places the variable shunt resistor $R_{HL}$, between resistors $R_{SH}$ and $R_{SL}$. Gradually changing the resistance value of $R_{HL}$ transitions the output current at the FORCE pin from the LTA to the HFA and vice versa.

In an illustrative example, assume that it is again desired to transition the output current at the FORCE pin from the LFA to the HFA. Switch SL is closed, switch SH is open, $R_{HL}$ is open (or set to a very large resistance) and current is being sourced from the FORCE pin to the LFA. Also assume that the LFA is again much smaller (e.g., 10X smaller). Switch SH is then closed and $R_{HL}$ is gradually closed or reduced. Gradually closing (or reducing) Rut gradually moves the current from the lower LFA circuit branch to the upper HFA circuit branch. $R_{HL}$ may be closed in steps (e.g., to change the voltage drop by 0.5 Volts. Switch SL is then opened. The reverse procedure can be used to move the current from the HFA to the LFA.

The devices, systems and methods described herein avoid test system errors due to switching at the output stage. The technique uses current clamp circuits inside the output stages. Because current clamp circuits may be included. to limit the output current delivered to the DUT, the technique does not require extra circuitry to reduce output glitches. The technique can be used in more applications than in the automated test systems described herein. The technique can be used in any application where it is desired to limit the current at the load of an electronic circuit or electronic system.

Additional Description And Aspects

A first Aspect (Aspect 1) includes subject matter (such as an automated testing system) comprising a high side switch circuit coupled to an input/output (I/O) connection, a low side switch circuit coupled to the I/O connection, a high side force amplifier (HFA) coupled to the high side switch circuit, a low side force amplifier (LFA) coupled to the low side switch circuit, an adjusting circuit coupled to the FIFA and the LFA, and a control circuit configured to change the adjusting circuit to change control of current at the I/O connection from one of the HFA or LFA to the other of the HFA or LFA.

In Aspect 2, the subject matter of Aspect 1 optionally includes a main circuit loop, and the control circuit is configured to change the adjusting circuit at a slower rate than a bandwidth of the main circuit loop.

In Aspect 3 the subject matter of one or both of Aspects 1 and 2 optionally includes an adjusting circuit including a first current clamp circuit coupled to HFA and a second current clamp circuit coupled to the LFA, and a control circuit configured to change the current of one or both of the first clamp circuit and second clamp circuit to change the control of the current at the I/O connection from one of the HFA or LFA to the other of the HFA or LFA.

In Aspect 4, the subject matter of one or any combination of Aspects 1-3 optionally includes an adjusting circuit including a variable resistor coupled between outputs of the HFA and LFA.

In Aspect 5, the subject matter of Aspect 4 optionally includes a variable resistor that is a continuously variable resistive circuit element.

In Aspect 6, the subject matter of Aspect 4 optionally includes a control circuit configured to change the resistance of the variable resistor in steps of a predetermined resistance step size.

In Aspect 7, the subject matter of one or any combination of Aspects 1-6 optionally includes an HFA and an LFA having active circuit elements of different sizes.

In Aspect 8, the subject matter of one or any combination of Aspects 1-7 optionally includes an LFA with active circuit elements of the output stage ten times smaller than active circuit elements of the output stage of the HFA.

In Aspect 9, the subject matter of one or any combination of Aspects 1-8 optionally includes an HFA that sources or sinks a higher current range at the I/O connection than the LFA.

Aspect 10 includes subject matter (such as a method of operating an automated test system) or can optionally be combined with one or any combination of Aspects 1-9 to include such subject matter, comprising sourcing or sinking current to a device under test (DUT) using a first force amplifier while a second force amplifier sources or sinks zero current to the DUT; and changing state of an adjustable circuit element to change the sourcing or sinking of current from the first force amplifier to the second force amplifier, wherein the state of the adjustable current element is changed at a rate slower than a bandwidth of a main circuit loop of the automated system.

In Aspect 11, the subject matter of Aspect 10 optionally includes changing an amount of current in a first current clamp circuit connected to the first force amplifier and changing an amount of current in a second current clamp circuit connected to the second force amplifier.

In Aspect 12, the subject matter of Aspect 11 optionally includes sourcing or sinking a first range of current to the DUT using the first force amplifier and sourcing or sinking a second range of current that is different from the first range of current using the second force amplifier.

In Aspect 13, the subject matter of one or any combination of Aspects 10-12 optionally includes changing a resistance of a variable resistance circuit element connected between an output of the first force amplifier and an output of the second force amplifier.

In Aspect 14, the subject matter of Aspect 13 optionally includes changing the resistance by a predetermined resistance step size.

In Aspect 15, the subject matter of Aspect 13 optionally includes continuously changing the value of resistance at the rate slower than the bandwidth of the main circuit loop of the automated system.

Aspect 16 includes subject matter or can optionally be combined with one or any combination of Aspects 1-15 to include such subject matter, such as a computer readable storage medium including instructions that, when performed processing circuitry of an automated testing circuit, cause the testing circuit to perform acts comprising initiating current to be provided to a device under test (DUT) using a first force amplifier while a second force amplifier provides zero current to the DUT; writing a register to change a state of an adjustable circuit element to change the current from being provided by the first force amplifier to being provided by the second force amplifier; and changing the state of the adjustable current element at a rate slower than a bandwidth of a main circuit loop of the testing circuit.

In Aspect 17, the subject matter of Aspect 16 optionally includes the computer readable storage medium having instructions that cause the testing circuit to perform acts including changing an amount of current in a first current clamp circuit connected to the first force amplifier, and changing an amount of current in a second current clamp circuit connected to the second force amplifier.

In Aspect 18, the subject matter of one or both of Aspects 16 and 17 optionally includes the computer readable storage medium having instructions that cause the testing circuit to change a resistance of a variable resistance circuit element connected between an output of the first force amplifier and an output of the second force amplifier.

In Aspect 19, the subject matter of one or any combination of Aspects 16-18 optionally includes the computer readable storage medium having instructions that cause the testing circuit to change the value of resistance of the variable resistance circuit element in steps at the rate slower than the bandwidth of the main circuit loop of the testing circuit.

In Aspect 20, the subject matter of one or any combination of Aspects 16-19 optionally includes the computer readable storage medium having instructions that cause the testing circuit to continuously change the value of resistance at the rate slower than the bandwidth of the main circuit loop of the testing circuit.

The non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or S meaning of the described aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment.

What is claimed is:

1. An automated testing system, the system comprising:
    a high side switch circuit coupled to an input/output (I/O) connection;
    a low side switch circuit coupled to the I/O connection;
    a high side force amplifier (HFA) coupled to the high side switch circuit;
    a low side force amplifier (LFA) coupled to the low side switch circuit;
    an adjusting circuit coupled to the HFA and the LFA; and
    a control circuit including a register, wherein the control circuit is configured to change the adjusting circuit by writing the register to change control of current at the I/O connection from one of the HFA or LFA to the other of the HFA or LFA.

2. The system of claim 1, wherein the automated testing system has a main circuit loop, and the control circuit is configured to change the adjusting circuit at a slower rate than a bandwidth of the main circuit loop.

3. The system of claim 1,
    wherein the adjusting circuit includes a first current clamp circuit coupled to HFA and a second current clamp circuit coupled to the LFA; and
    wherein the control circuit is configured to change the current of one or both of the first clamp circuit and second clamp circuit to change the control of the current at the I/O connection from one of the HFA or LFA to the other of the HFA or LFA.

4. The system of claim 1,
    wherein the adjusting circuit includes a variable resistor coupled between outputs of the HFA and LFA; and
    wherein the control circuit is configured to change a resistance of the variable resistor to change the control of the current at the I/O connection from one of the HFA or LFA to the other of the HFA or LFA.

5. The system of claim 4, wherein the variable resistor is a continuously variable resistive circuit element.

6. The system of claim 4, wherein the control circuit is configured to change the resistance of the variable resistor in steps of a predetermined resistance step size.

7. The system of claim 1, wherein the HFA and the LFA have active circuit elements of different sizes.

8. The system of claim 1, wherein active circuit elements of the output stage of the LFA are ten times smaller than active circuit elements of the output stage of the HFA.

9. The system of claim 1, wherein the HFA sources or sinks a higher current range at the I/O connection than the LFA.

* * * * *